United States Patent [19]

Hashimoto

[11] Patent Number: 4,761,765
[45] Date of Patent: Aug. 2, 1988

[54] SEMICONDUCTOR MEMORY DEVICE HAVING IMPROVED DATA OUTPUT CIRCUIT

[75] Inventor: Kiyokazu Hashimoto, Tokyo, Japan

[73] Assignee: NEC Corporation, Tokyo, Japan

[21] Appl. No.: 690,904

[22] Filed: Jan. 14, 1985

[30] Foreign Application Priority Data

Jan. 13, 1984 [JP] Japan ................................. 59-4315

[51] Int. Cl.⁴ .............................................. G11C 11/40
[52] U.S. Cl. .................................... 365/185; 365/210; 365/208
[58] Field of Search ............... 365/210, 189, 104, 205, 365/207, 208, 185; 307/530, 296 R, 297

[56] References Cited

U.S. PATENT DOCUMENTS

4,223,394 9/1980 Pathak et al. ...................... 365/210
4,301,518 11/1981 Klaas ................................... 365/207

FOREIGN PATENT DOCUMENTS

57-71575  5/1982 Japan .
0056290   4/1983 Japan .
0208990  12/1983 Japan .
0014194   1/1984 Japan ................................. 365/104

*Primary Examiner*—Stuart N. Hecker
*Assistant Examiner*—Glenn A. Gossage
*Attorney, Agent, or Firm*—Sughrue, Mion, Zinn, Macpeak & Seas

[57] ABSTRACT

A semiconductor memory device is disclosed in which an output data voltage of a sense amplifier is compared with a reference voltage to produce an output data corresponding to the data stored in the selected memory cell. The reference voltage is generated in response to a current flowing through a dummy memory transistor having the same device structure as a memory transistor and is thus variable if the current flowing through the memory transistor is deviated from the designed value.

1 Claim, 4 Drawing Sheets

SEMICONDUCTOR MEMORY DEVICE HAVING IMPROVED DATA OUTPUT CIRCUIT

BACKGROUND OF THE INVENTION

The present invention relates to a semiconductor memory device, and more particularly to a data output circuit in a memory device formed as an integrated circuit device.

A semiconductor memory device includes a plurality of memory cells arranged in a matrix of rows and columns, a plurality of digit lines coupled with memory cells at the respective columns, a selection circuit responding to address signals and selecting one of the rows and one of columns to designate one memory cell, and a data output circuit detecting the potential on the selected digit line, which represents the data stored in the selected memory cell, and producing an output data of "0" or "1" which corresponds to the data stored in the selected memory cell.

The memory capacity of the memory device has been increased more and more in recent years, so that the number of memory cells coupled to each digit line is made large. Each digit line thereby becomes long to make the stray capacitance thereof large. As a result, a time constant for charging and discharging each digit line becomes large and the speed for producing the output data is made slow.

In order to enhance the data output speed, it is required to suppress the change in potential on each digit line responsive to the data stored in the selected memory cell and to detect such a relatively small potential change on each digit line. For this purpose, the data output circuit is composed of an inverting amplifier which is operatively connected to the selected digit line and which is provided with a feedback loop, a reference voltage generator generating a reference voltage, and a comparator comparing the output voltage of the amplifier with the reference voltage.

It will be assumed that the selected memory cell draws no current when its storing data is "0" and draws a predetermined current when its storing data is "1". The digit line is therefore charged by the inverting amplifier when the data stored in the selected memory cell is "0". Since the inverting amplifier is provided with the feedback loop, the digit line is charged up to such a level that the potential thereon becomes equal to the output potential of the inverting amplifier. The output potential of the amplifier in this case is indicated as a first output level. When the selected memory cell stores the data of "1", it discharges the digit line with the predetermined current. The potential on the digit line is thereby lowered, but the lowering of the digit line potential is suppressed by the feedback loop of the inverting amplifier. Since the potential on the digit line is lowered, the output potential of the inverting amplifier increases. The output potential at this time is determined by the current drawn by the selected memory cell, an impedance of the feedback loop and the potential at the digit line, and is indicated as a second output level.

The reference voltage generated by the generator is designed to take an approximately intermediate level between the first and second output levels of the inverting amplifier. Accordingly, the comparator produces the output data of "0" or "1" in response to the output level of the inverting amplifier.

Thus, the change in potential on the digit line responsive to the data stored in the selected memory cell is suppressed, and such a small potential change of the digit line appears as the amplified output level change of the inverting amplifier. Accordingly, the data stored in each memory cell is read out at a high speed.

As well known in the art, it is unavoidable that the memory cells in the integrated circuit memory device are actually formed with dimensions deviated from the designed values because of the change in the manufacturing condition, for example. As a result, the current actually drawn by each memory cell becomes larger than the designed value, or smaller than it. Since the second output level of the inverting amplifier is determined by the current drawn by the memory cell as described above, the difference between the second output level and the reference voltage becomes larger or smaller than the designed value. The comparator is generally composed of a differential amplifier, and therefore it requires a voltage difference above a predetermined value between its two input voltages in order to produce the output data of "1" or "0". The comparator produces an intermediate level between the data "1" and "0" if the difference between the second output level (high level) of the inverting amplifier and the reference voltage is smaller than the designed value due to the deviation of the current of each memory cell to a smaller value. On the other hand, if the difference between the second output level and the reference voltage is too large as compared with its designed value due to a large current drawn by each memory cell, the change in potential from the second level to the first level is broadened to deteriorate the speed for the data read operation.

SUMMARY OF THE INVENTION

It is, therefore, an object of the present invention is to provide a memory device including an improved data output circuit.

Another object of the present invention is to provide a memory device including a data output circuit in which a reference voltage generator generates a variable reference voltage in accordance with the change in current ability of the memory cells.

A memory device according to the present invention comprises a plurality of memory cells, a selection circuit selecting at least one memory cell, means responsive to a current flowing through the selected memory cell for producing a data voltage, a voltage generator including a current source and generating a reference voltage in response to a current flowing through the current source, the current source having the substantially same current characteristic as that of at least one of the memory cells, and means responsive to a difference between the data voltage and the reference voltage for outputting an output data relative to the data stored in the selected memory cell.

Since the current source has the substantially same current characteristic as a memory cell, the current flowing therethrough is varied in accordance with the change or deviation from a designed value in current flowing through the memory cell. Therefore, the difference between the data voltage and the reference voltage is substantially constant irrespective of the change or deviation in current flowing through the memory cell. In other words, the voltage generator in the memory device of the present invention generates a variable reference voltage in accordance with the manufacturing conditions of the memory device.

The current source having the above-mentioned current characteristic may be formed of a dummy memory cell having the same device structure as each memory cell.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENT

Figure 1:
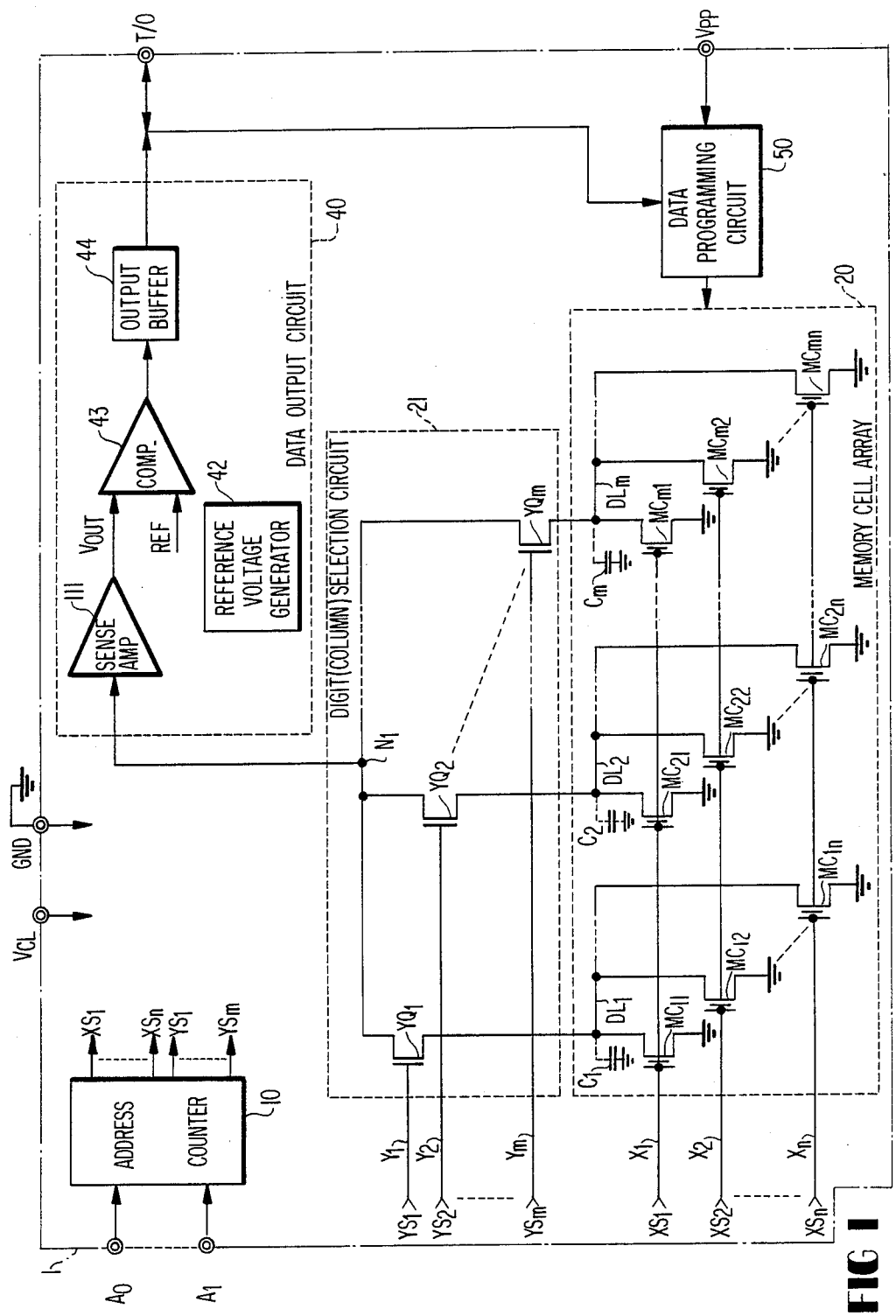
FIG. 1 is a block diagram of a memory device according to an embodiment of the present invention.

Referring to FIG. 1, there is shown an electrically programmable read only memory device (called hereinafter as an "EPROM") according to one embodiment of the present invention. This EPROM is formed as an integrated circuit device 1 and employs the so-called SAMOS (Stacked Gate Avalanche Injection type Metal Oxide Semiconductor) transistors as memory cells $MC_{11}$ to $MC_{mn}$ in a memory cell array 20.

Figure 8:
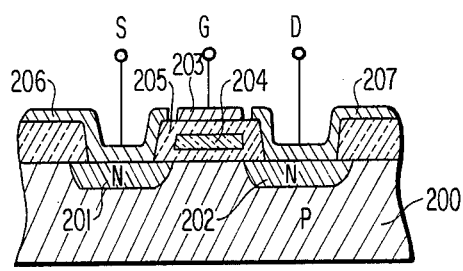
FIG. 8 is a cross-sectional view of the so-call FAMOS transistor employed as memory cells and a dummy memory cell.

The device structure of the SAMOS transistor is shown in FIG. 8. Source and drain regions 201 and 202 of one conductivity type (an N-type in this embodiment) are formed in a silicon substrate 200 of the opposite conductivity type (i.e. a P-type). A floating gate 204 surrounded by a silicon oxide 205 and a control gate 203 stacked thereon are provided on a channel region between the source and drain regions 201 and 202. The control gate 203 is connected to a row address line ($X_1$, $X_2$, ..., or $X_n$ in FIG. 1). The source and drain electrodes 206 and 207 are connected to the source and drain regions 201 and 202, respectively. When a high voltage is applied between the source and drain 206 and 207, an avalanche phenomenon occurs to inject electrons into the floating gate 204, whereby the transistor is programmed and data "0" is written therein.

Referring back to FIG. 1, the memory cell array 20 includes a plurality of the memory cells MC arranged in rows and columns, a plurality of column digit lines $DL_1$ to $DL_m$ connected to memory cells at the respective columns, and row address lines $X_1$ to $X_n$ connected to the control electrodes of the memory cells at the respective rows. Thus, the memory cells $MC_{11}$ to $MC_{mn}$ are disposed at the respective intersections of the digit lines $DL_1$ to $DL_m$ and the row address lines $X_1$ to $X_n$. The digit lines are connected to a digit (column) selection circuit 21 which comprises column address switching transistors $YQ_1$ to $YQ_m$ connected between a first node $N_1$ and the respective digit (column) lines $DL_1$ to $DL_m$ and column address lines $Y_1$ to $Y_m$ connected to the gates of the switching transistors $YQ_1$ to $YQ_m$, respectively. The digit lines $DL_1$ to $DL_m$ have stray capacitances $C_1$ to $C_m$, respectively. The row address lines $X_1$ to $X_n$ are supplied with row address selection signals $XS_1$ to $XS_n$, respectively, one of which is energized in selection operation, and the column address lines $Y_1$ to $Y_m$ are supplied with column address selection signals $YS_1$ to $YS_m$, respectively, one of which is also energized in the selection operation.

The respective address selection signals $XS_1$ to $XS_n$ and $YS_1$ to $YS_m$ are generated by an address decoder 10. The decoder 10 responds to address signals supplied to address input terminals $A_0$ to $A_l$ and energizes one of the row address selection signals $XS_1$ to $XS_n$ and one of the column address selection signals $YS_1$ to $YS_m$ to the high level. As a result, one of the memory cells $MC_{11}$ to $MC_{mn}$ is selected.

The data stored in the selected memory cell is supplied to a data output circuit 40 through the first node $N_1$. The output circuit 40 is composed of a sense amplifier 41, a reference voltage generator 42, a comparator 43, and an output buffer 44, and produces an output data which is supplied to an input/output terminal I/O.

The terminal I/O is further supplied externally with data to be programmed in the selected memory cell, and thus it is connected to a data programming circuit 50. The programming circuit 50 is activated by a programming voltage supplied to a terminal $V_{pp}$ to program the data in the selected memory cell. A power supply voltage is applied to a $V_{cc}$ terminal, and a GND terminal is applied with the ground potential.

Figure 2:
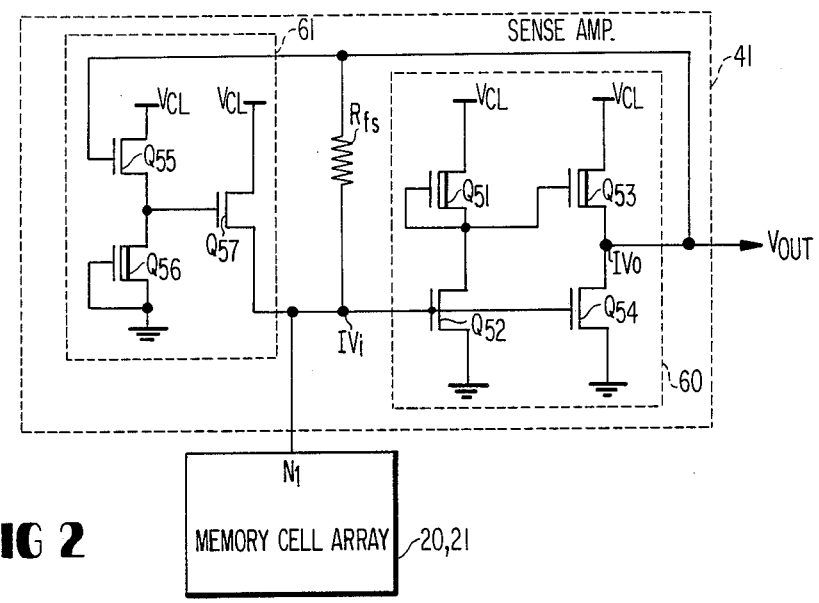
FIG. 2 is a circuit diagram of a sense amplifier shown in FIG. 1.

FIG. 2 shows the sense amplifier 41 according to the embodiment of the invention. This amplifier 41 is composed of an inverting amplifier 60 of a push-pull type having an input end $IV_i$ connected to the first node $N_1$ of the column selection circuit 21, a feedback resistor $R_{fs}$ connected between the input and output ends $IV_i$ and $IV_o$ of the inverting amplifier 60, and a rapid charging circuit 61 connected to the input end $IV_i$. The inverting amplifier 60 includes four N-type field effect transistors $Q_{51}$ to $Q_{54}$. The transistors $Q_{52}$ and $Q_{54}$ are enhancement-type N-channel field effect transistors and have gates connected to the input end $IV_i$. The transistor $Q_{51}$ is of a depletion type and operates as a load of the transistor $Q_{52}$, and the transistor $Q_{53}$ is of a shallow depletion type and cooperates with the transistor $Q_{54}$ to constitute the pushpull output stage. The charging circuit 61 includes three N-channel field effect transistors $Q_{55}$ to $Q_{57}$. The transistor $Q_{55}$ is of a shallow enhancement type and has a gate connected to the output end $IV_o$ of the inverting amplifier 60. The transistor $Q_{56}$ is of a depletion type and operates as a load of the transistor $Q_{55}$, and the transistor $Q_{57}$ is of a shallow enhancement type and connected between the $V_{cc}$ terminal and the input end $IV_i$. The transistor $Q_{57}$ is controlled by the potential at the connection point of the transistors $Q_{55}$ and $Q_{56}$. An output voltage $V_{out}$ of the sense amplifier 41 is derived from the output end $IV_o$.

In the above description and the following description, the transistor of the "shallow" depletion type means that its threshold voltage is smaller than that of the transistor of the normal depletion type. Similarly, the transistor of the "shallow" enhancement type has a threshold voltage smaller than that of the transistor of the normal enhancement type.

Figure 3:
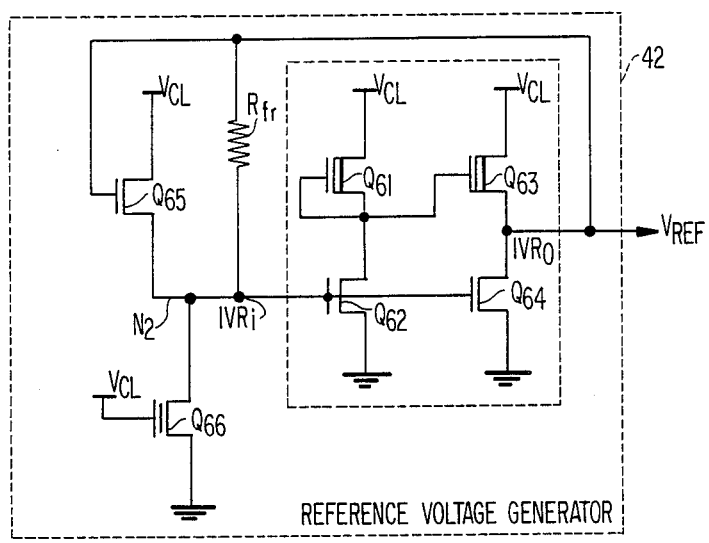
FIG. 3 is a circuit diagram of a reference voltage generator shown in FIG. 1.

As shown in FIG. 3, the reference voltage generator 42 comprises an inverting amplifier 62 having input and output ends $IVR_i$ and $IVR_o$, a feedback resistor $R_{fr}$ connected between the input and output ends $IVR_i$ and $IVR_o$ of the amplifier 62, and a clamping transistor $Q_{65}$. The inverting amplifier 62 has the same circuit construction as the inverting amplifier 61, and thus includes two transistors $Q_{62}$ and $Q_{64}$ of the enhancement type, a transistor $Q_{61}$ of the depletion type and a transistor $Q_{63}$ of the shallow depletion type. Its input end $IVR_i$ is connected to a second node $N_2$. The transistor $Q_{65}$ is of the shallow enhancement type similarly to the transistor $Q_{57}$. According to the embodiment of the invention, a dummy memory cell transistor $Q_{66}$ is connected between the second node $N_2$ and the ground potential, operating as a current source. The dummy memory cell transistor $Q_{66}$ has the same device construction as one of the memory cells $MC_{11}$ to $MC_{mn}$ (see FIG. 8), and hence it is a SAMOS transistor. The resistance value of the resistor $R_{fr}$ is designed to be smaller than that of the resistor $R_{fs}$. A reference voltage $V_{REF}$ is obtained at the output end $IVR_o$.

Figure 4:
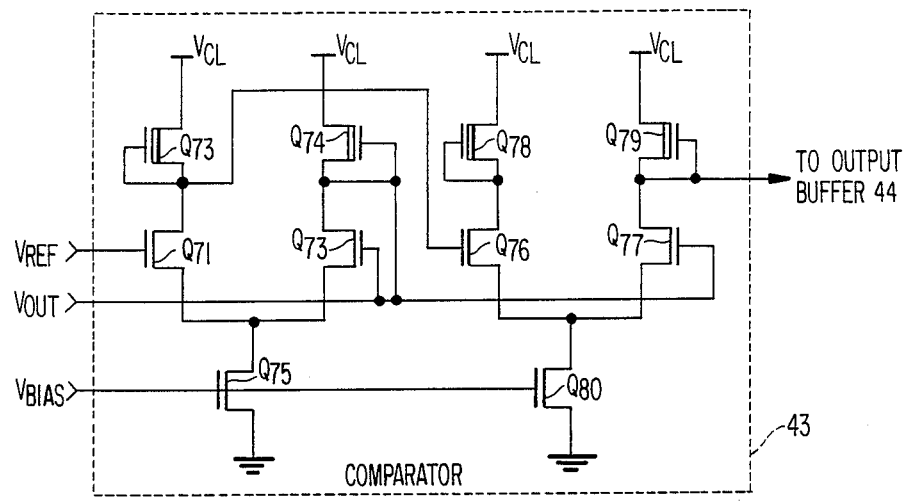
FIG. 4 is a circuit diagram of a comparator shown in FIG. 1.

FIG. 4 shows an example of the comparator 43, in which two pairs of transistors ($Q_{71}$ and $Q_{72}$) and ($Q_{76}$ and $Q_{77}$) constitute a differential amplifier, respectively. Transistors $Q_{75}$ and $Q_{80}$ are supplied with a bias voltage at their gates, and thus operate as a current source, respectively. Transistors $Q_{73}$, $Q_{74}$, $Q_{78}$ and $Q_{79}$ are of the depletion type and serve as loads of the transistors $Q_{71}$, $Q_{72}$, $Q_{76}$ and $Q_{77}$, respectively.

Turning back to FIG. 1, the address decoder 10 energizes one of the row address selection signals $XS_1$ to $XS_n$ to the high level in response to the address signals. The decoder 10 also energizes one of column address selection signals $YS_1$ to $YS_m$ to the high level. Assuming that the first row and column address selection signals $XS_1$ and $YS_1$ are energized to the high level, the transistor $YQ_1$ is turned ON and the memory cell $MC_{11}$ is supplied at its gate with a reading-out voltage. The memory cell $MC_{11}$ is thereby selected. In the case where this selected memory cell $MC_{11}$ is programmed, or stores the data "0", the cell $MC_{11}$ is maintained in the OFF-state since electrons are injected into its floating gate to make its threshold voltage higher than the reading-out voltage. Accordingly, the cell $MC_{11}$ draws no current. On the other hand, when the cell $MC_{11}$ is non-programmed, or stores the data "1", it is turned ON by the reading-out voltage to draw a current from the digit line $DL_1$.

Figure 5:
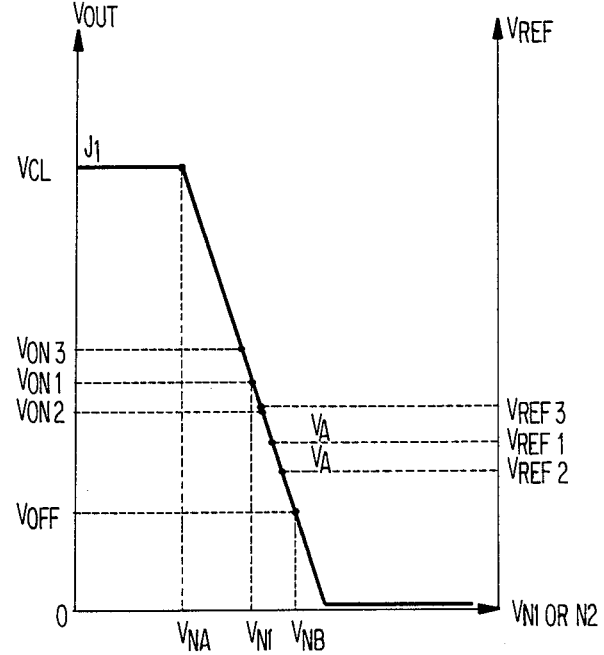
FIG. 5 is a voltage characteristic diagram of the sense amplifier and the reference voltage generator.

Assuming that the programmed memory cell $MC_{11}$ is selected in the case where there is no charge in the stray capacitance $C_1$ on the selected digit line $DL_1$, the output voltage $V_{OUT}$ of the sense amplifier 41 approximately takes the power supply voltage $V_{cc}$, as shown by $J_1$ in FIG. 5. Since the difference between the output voltage $V_{OUT}$ of the amplifier 41 and a potential $V_{N1}$ at the first node $N_1$ (see FIG. 2) is sufficiently larger than the threshold voltages $V_{T55}$ and $V_{T57}$ of the transistors $Q_{55}$ and $Q_{57}$, the transistors $Q_{55}$ and $Q_{57}$ are turned ON to rapidly charge the stray capacitance $C_1$ of the selected digit line $DL_1$. The potential $V_{N1}$ is thereby increased. When the potential $V_{N1}$ rises to a level $V_{NA}$ as shown in FIG. 5, the transistors $Q_{52}$ and $Q_{54}$ are turned ON. Accordingly, the inverting amplifier 60 thereafter changes its output voltage $V_{OUT}$ at a rate which is determined by its amplification gain and the change in the input node potential $V_{N1}$. If the gain of the inverting amplifier 60 is 20, the output voltage $V_{OUT}$ takes the change of 4 volts in response to the change of 0.2 volt in the input node potential $V_{N1}$.

When the voltage difference between the output voltage $V_{OUT}$ and the input node potential $V_{N1}$ becomes smaller than the threshold voltages $V_{T55}$ and $V_{T57}$, the transistors $Q_{55}$ and $Q_{57}$ are turned OFF. Accordingly, the first node $N_1$ is thereafter charged by a current flowing only through the feedback resistor $R_{fs}$, and finally charged up to the level that is equal to the output voltage $V_{OUT}$ of the sense amplifier 41. The levels of the output voltage $V_{OUT}$ and the input node potential $V_{N1}$ at this time are indicated by $V_{off}$ and $V_{NB}$ in FIG. 5, respectively.

In response to the change in address signals, the decoder 10 selects another memory cell. Assuming that the memory cell $MC_{12}$ is selected and that this cell is non-programmed, or stores the data "1", the memory cell $MC_{12}$ is turned ON to discharge the first node $N_1$ by a current $I_{ON}$ flowing therethrough. The potential $V_{N1}$ is thereby lowered. In response to that, the output voltage $V_{OUT}$ of the inverting amplifier 60 is changed by a level determined by its amplification gain and the change in the input node potential $V_{N1}$. The output voltage $V_{OUT}$ is thus stabilized when the current flowing through the feedback resistor $R_{fs}$ becomes equal to the current $I_{ON}$ flowing through the selected memory cell $MC_{12}$, and hence its level $V_{ON1}$ is represented by the following equation:

$$V_{ON1} = V_{NC} + R_{fs} \cdot I_{ON} \quad (1)$$

where $V_{NC}$ indicates the input node potential at this time.

In FIG. 3, since the inverting amplifier 62 has the same circuit construction as the inverting amplifier 60 and since the dummy cell transistor $Q_{66}$ has the same device structure as each memory cell to draw a current that is substantially equal to the current $I_{ON}$ flowing through the non-programmed memory cell $MC_{12}$, the reference voltage $V_{REF}$ generated from the generator 42 takes the following level $V_{REF1}$:

$$V_{REF1} = V_{N2} + R_{fr} \cdot I_{ON} \quad (2)$$

where $V_{N2}$ represents the potential at the input end $IVR_i$ or the input node $N_2$ of the inverting amplifier 62 and is substantially equal to the potential level $V_{NC}$. The resistance value of the resistor $R_{fr}$ is designed such that the reference voltage $V_{REF1}$ takes an approximately intermediate level between two output levels $V_{off}$ and $V_{ON1}$ of the output voltage $V_{OUT}$ which the inverting amplifier 60 produces in response to the data of the selected memory cell.

When the programmed memory cell is selected, i.e., when the sense amplifier 40 produces the output voltage $V_{OUT}$ of $V_{off}$ level, the transistors $Q_{72}$ and $Q_{76}$ (FIG. 4) are turned OFF, and the transistors $Q_{71}$ and $Q_{77}$ are turned ON. As a result, the output of the comparator 43 takes the low level. On the other hand, when the non-programmed memory cell is selected, the transistor $Q_{77}$ is turned OFF to produce the high level output.

If the output voltage $V_{OUT}$ of the sense amplifier 41 and the reference voltage $V_{REF1}$ take the same level, all the transistors $Q_{71}$ to $Q_{80}$ are in the ON state. For this reason, the output of the comparator 43 may take an intermediate level between the high level and the low level. In order to obtain the high level output or the low level output, the comparator 43 requires a voltage difference between its input voltages $V_{REF}$ and $V_{OUT}$ to be above a predetermined value (which is indicated by $V_a$ in FIG. 5). This means that the output levels $V_{ON1}$ and $V_{off}$ of the output voltage $V_{OUT}$ should be selected so as to satisfy the following relationship:

$$V_{REF1} - V_{off} \geqq V_a \qquad (3)$$

$$V_{ON1} - V_{REF1} \geqq V_a \qquad (4)$$

It is unavoidable that the gate length and/or gate width of the actually formed SAMOS transistors constituting the memory cells $MC_{11}$ to $MC_{mn}$ are deviated from the designed value(s). If the gate length of each memory cell transistor is larger than the designed value and/or its gate width is smaller than the designed value, the current flowing through each non-programmed memory cell becomes smaller than the designed current $I_{ON}$. The voltage drop across the feedback resistor $R_{fs}$ is thereby lowered, so that the output voltage $V_{OUT}$ of the inverting amplifier 60 is changed from the $V_{ON1}$ level to the $V_{ON2}$ level as shown in FIG. 5. Assuming that the level of the reference voltage $V_{REF}$ is maintained constantly, the difference between the $V_{ON2}$ level and the reference voltage $V_{REF1}$ becomes smaller and may be less than $V_a$. If it occurs, the comparator 43 does not perform its voltage comparison operation. On the other hand, if the actual gate length of each memory cell transistor is smaller than the designed value and/or its actual gate width is larger than the designed value, the current flowing through each non-programmed memory cell is larger than the designed current $I_{ON}$. Accordingly, the voltage drop across the feedback resistor $R_{fs}$ is made large to increase the stabilized output voltage $V_{OUT}$ to the $V_{ON3}$ level as shown in FIG. 5. If the reference voltage $V_{REF}$ is constant, the difference between the reference voltage $V_{REF1}$ and the $V_{ON3}$ level thereby expands unnecessarily beyond $V_a$. If the next selected memory cell is the programmed one, the output voltage $V_{OUT}$ of the inverting amplifier 60 should fall down to the $V_{off}$ level by the charging of the first node $N_1$. The charging current is supplied through the feedback resistor $R_{fs}$, and hence it takes a relatively long time to charge the node $N_1$ and to change the output voltage $V_{OUT}$ from the $V_{ON3}$ level down to the $(V_{REF1} - V_a)$ level. The data read-out speed is thus made slow.

According to the present invention, the reference voltage $V_{REF}$ is not constant, but variable with the derivation of the device sizes. The dummy cell transistor $Q_{66}$ is provided in the reference voltage generator 42 as shown in FIG. 3, and therefore its gate length and/or width are varied similarly to the change in the gate length and/or width of each memory cell transistor. Therefore, the actual current flowing through the dummy cell transistor $Q_{66}$ becomes smaller than the designed value when the actual current flowing through each non-programmed memory cell is smaller than the designed value. The reference voltage $V_{REF}$ thereby takes the $V_{REF2}$ level as shown in FIG. 5, and the voltage difference between the $V_{ON2}$ level and the $V_{REF2}$ level is not decreased less than $V_a$. As a result, the comparator 43 responds the $V_{ON2}$ and $V_{REF2}$ levels and produces the high level output. It should be noted that the $(V_{REF2} - V_a)$ level is designed to be higher than the $V_{off}$ level. When the current flowing through each non-programmed memory cell transistor is larger than the designed value, the current flowing through the dummy cell transistor $Q_{66}$ is also larger than the designed value. Accordingly, the voltage drop across the resistor $R_{fr}$ is made large to change the reference voltage $V_{REF}$ to the $V_{REF3}$ level. In other words, the difference between the $V_{REF3}$ and $V_{ON3}$ levels does not substantially change from the difference between the $V_{REF1}$ and $V_{ON1}$ levels. A time for changing the output voltage $V_{OUT}$ from the $V_{ON3}$ level to the $(V_{REF3} - V_a)$ level does not change. Though the difference between the $V_{REF3}$ level and the $V_{off}$ level is broadened, the discharging of the node $N_1$ is carried out not by a resistor alone but by the memory cell transistor, and therefore the deterioration of the discharging speed is substantially small.

Since the source-gate paths of the transistors $Q_{55}$ and $Q_{57}$ are provided between the input and output ends $IV_i$ and $IV_o$ of the inverting amplifier 60, the output voltage $V_{OUT}$ is clamped to the following value:

$$V_{OUT} = V_{N1} + V_{T55} + V_{T57} \qquad (5)$$

where $V_{T55}$ and $V_{T57}$ represent the threshold voltages of the transistors $Q_{55}$ and $Q_{57}$, respectively. The source-gate path of the transistor $Q_{65}$ is provided between the input and output ends $IVR_i$ and $IVR_o$ of the inverting amplifier 62, and therefore the reference voltage $V_{REF}$ is clamped to the following value:

$$V_{REF} = V_{N2} + V_{T65} \qquad (6)$$

where $V_{T65}$ denotes the threshold voltage of the transistor $Q_{65}$. Accordingly, even if the considerably large currents flow through each non-programmed memory cell transistor and the dummy cell transistor $Q_{66}$, the output voltage $V_{OUT}$ and the reference voltage $V_{REF}$ are clamped to prevent the difference voltage therebetween from being broadened undesirably.

Figure 6:
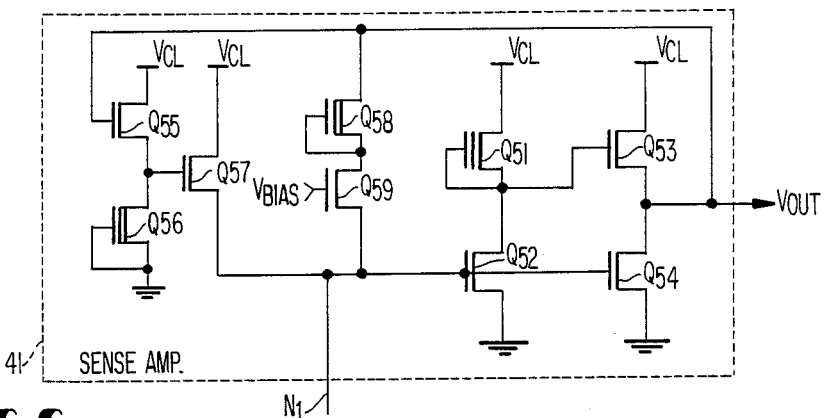
FIG. 6 is a circuit diagram of another example of the sense amplifier.
Figure 7:
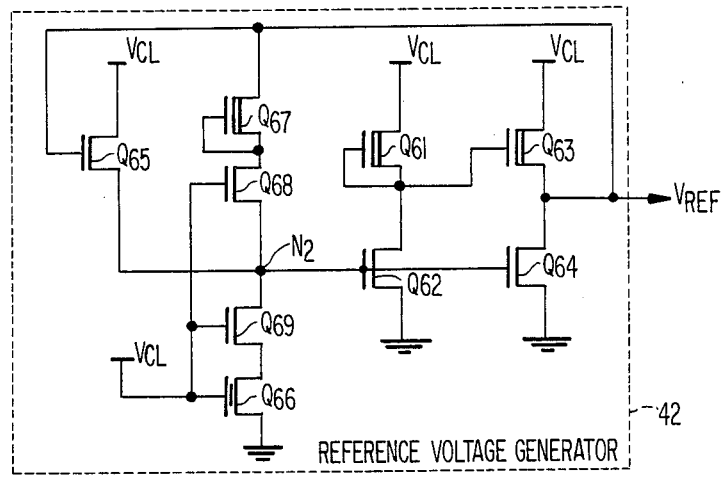
FIG. 7 is a curcuit diagram of another example of the reference voltage generator.

In FIGS. 2 and 3, the feedback resistors $R_{fs}$ and $R_{fr}$ each have a relatively high resistance value, and therefore their occupying areas on an integrated circuit chip are large. FIGS. 6 and 7 show another examples of the sense amplifier 41 and the reference voltage generator 42 in which the resistor $R_{fs}$ is replaced by two transistors $Q_{58}$ and $Q_{59}$ and the resistor $R_{fr}$ is replaced by two transistors $Q_{67}$ and $Q_{68}$ in order to decrease the chip area. The transistors $Q_{58}$ and $Q_{67}$ are of the depletion type and those $Q_{59}$ and $Q_{68}$ are of the enhancement type. The transistor $Q_{59}$ is supplied with a bias voltage $V_{bias}$. The generator shown in FIG. 7 further includes a transistor $Q_{69}$ of the enhancement type connected between the input node $N_2$ and the dummy cell transistor $Q_{66}$. This improves the similarity with the sense amplifier 41, because the column address switching transistor QY is connected between the input node $N_1$ of the sense amplifier 41 and the selected memory cell transistor as shown in FIG. 1.

The present invention is not limited to the above embodiments, but may be modified and changed without departing from the scope and spirit of the invention. For example, the so-call FAMOS (Floating Gate Avalanche Injection type Metal Oxide Semiconductor) transistor may be employed as each memory cell and the dummy cell transistor $Q_{66}$. All the transistors described above are of an N-channel type, but P-channel type transistors or complementary MOS transistors may be used. The data of a plurality of memory cells are often read out simultaneously in some memory devices, and in that case a plurality of the memory cell array 20 and the data output circuit 40 is provided. Moreover, the present invention is applicable to memory devices of other types such as a read only memory device and a random access memory device.

What is claimed is:

1. A semiconductor memory comprising a plurality of memory transistors, each having a control gate, a floating gate and a source-drain current path; first and second power supply terminals; a circuit node; means responsive to a set of address signals for selecting one of said memory transistors to connect the source-drain current path of the selected memory transistor between said circuit node and said first power supply terminal, said selected memory transistor producing a current in response to data "1" stored therein and no current in response to data "0" stored therein; a sense amplifier including a first inverting amplifier having an input terminal connected to said circuit node and an output terminal, a first transistor of a depletion type having a source-drain current path connected between the input and output terminals of said first inverting amplifier and a gate connected to one of its source and drain, said first transistor representing a first feedback resistor having a first resistance value, a second transistor of an enhancement type having a source-drain current path connected between said second power supply terminal and the input terminal of said first inverting amplifier, a third transistor of said enhancement type having a gate connected to the output terminal of said first inverting amplifier and a source-drain current path connected between said second power supply terminal and a gate of said second transistor, the output terminal of said first inverting amplifier taking a first potential when the selected memory cell stores data "1" and a second potential when the selected memory cell stores data "0"; a reference voltage generator including a second inverting amplifier having input and output terminals, a single dummy memory transistor having a floating gate, a control gate connected to said second power supply terminal and a source-drain current path connected between said first power supply terminal and the input terminal of said second inverting amplifier, said dummy memory transistor having the same structure as the memory transistor and producing a current that is substantially equal to the current produced by the selected memory transistor, a fourth transistor of said depletion type having a source-drain current path connected between the input and output terminals of said second inverting amplifier and a gate connected to one of its source and drain, said fifth transistor representing a second feedback resistor having a second resistance value that is smaller than said first resistance value, a fifth transistor of said enhancement type having a gate connected to the output terminal of said second inverting amplifier and a source-drain current path connected between said second power supply terminal and the input terminal of said second inverting amplifier, the output terminal of said second inverting amplifier taking a reference potential that is an intermediate level between said first and second potentials; and a comparator having input terminals connected respectively to the output terminals of said first and second inverting amplifier and comparing the potential at the output terminal of said first inverting amplifier with said reference potential to produce an output data signal representative of the data stored in the selected memory cell; wherein the output terminal of said first inverting amplifier is clamped to a first level larger than a potential of the input terminal thereof by threshold voltages of said second and third transistors when said second and third transistors are turned ON and the output terminal of said second inverting amplifier is clamped to a second level larger than a potential of the input terminal thereof by a threshold voltage of said fifth transistor when said fifth transistor is turned ON, said first level being smaller than said second level.

* * * * *